(12) United States Patent
Nakamura et al.

(10) Patent No.: US 8,810,035 B2
(45) Date of Patent: Aug. 19, 2014

(54) SEMICONDUCTOR BONDING STRUCTURE BODY AND MANUFACTURING METHOD OF SEMICONDUCTOR BONDING STRUCTURE BODY

(75) Inventors: Taichi Nakamura, Osaka (JP); Akio Furusawa, Osaka (JP); Shigeaki Sakatani, Osaka (JP); Hidetoshi Kitaura, Osaka (JP); Yukihiro Ishimaru, Mie (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/823,463

(22) PCT Filed: Oct. 17, 2011

(86) PCT No.: PCT/JP2011/005790
§ 371 (c)(1),
(2), (4) Date: Mar. 14, 2013

(87) PCT Pub. No.: WO2012/053178
PCT Pub. Date: Apr. 26, 2012

(65) Prior Publication Data
US 2013/0241069 A1  Sep. 19, 2013

(30) Foreign Application Priority Data

Oct. 22, 2010  (JP) ................. 2010-237514

(51) Int. Cl.
| | | |
|---|---|---|
| H01L 23/00 | (2006.01) | |
| B23K 35/26 | (2006.01) | |
| H01L 21/56 | (2006.01) | |
| B23K 35/30 | (2006.01) | |
| C22C 5/02 | (2006.01) | |
| C22C 13/00 | (2006.01) | |
| C22C 5/06 | (2006.01) | |
| B23K 35/02 | (2006.01) | |
| B23K 1/00 | (2006.01) | |
| C22C 9/00 | (2006.01) | |
| C22C 1/04 | (2006.01) | |

(52) U.S. Cl.
CPC ............ *H01L 24/30* (2013.01); *B23K 35/26* (2013.01); *H01L 2924/01019* (2013.01); *H01L 2224/48091* (2013.01); *H01L 21/563* (2013.01); *B23K 35/3013* (2013.01); *H01L 24/83* (2013.01); *H01L 2924/0132* (2013.01); *B23K 35/302* (2013.01); *H01L 23/562* (2013.01); *H01L 2924/01029* (2013.01); *B23K 2201/40* (2013.01); *C22C 5/02* (2013.01); *H01L 2224/32245* (2013.01); *H01L 2924/01327* (2013.01); *H01L 2224/29* (2013.01); *C22C 1/0483* (2013.01); *C22C 13/00* (2013.01); *H01L 2224/73265* (2013.01); *H01L 24/27* (2013.01); *C22C 5/06* (2013.01); *H01L 24/29* (2013.01); *H01L 2224/83* (2013.01); *B23K 35/0238* (2013.01); *B23K 35/3006* (2013.01); *B23K 1/0016* (2013.01); *H01L 2924/01322* (2013.01); *B23K 35/262* (2013.01); *H01L 2924/01079* (2013.01); *C22C 9/00* (2013.01); *B22F 2999/00* (2013.01); *H01L 2224/48247* (2013.01)
USPC ........................................... 257/762; 438/612

(58) Field of Classification Search
USPC ........... 257/762; 438/612; 174/26; 228/180.1
See application file for complete search history.

(56) References Cited

U.S. PATENT DOCUMENTS

| | | | | |
|---|---|---|---|---|
| 7,009,299 | B2* | 3/2006 | Angst et al. | 257/772 |
| 8,598,464 | B2* | 12/2013 | Sakatani et al. | 174/260 |
| 8,633,103 | B2* | 1/2014 | Hata et al. | 438/614 |
| 2006/0186550 | A1 | 8/2006 | Ikeda et al. | |
| 2010/0247955 | A1 | 9/2010 | Takahashi et al. | |
| 2011/0042815 | A1* | 2/2011 | Ikeda et al. | 257/762 |

FOREIGN PATENT DOCUMENTS

| | | |
|---|---|---|
| JP | 9-174278 A | 7/1997 |
| JP | 2006-237215 A | 9/2006 |
| JP | 2007-273982 | 10/2007 |
| JP | 2008-80392 A | 4/2008 |

OTHER PUBLICATIONS

International Search Report for PCT/JP2011/005790, Jan. 17, 2012.

* cited by examiner

*Primary Examiner* — Roy Potter
(74) *Attorney, Agent, or Firm* — RatnerPrestia

(57) ABSTRACT

A bonding structure body in which a semiconductor element and an electrode are bonded via a solder material, wherein a part that allows bonding has a first intermetallic compound layer that has been formed on the electrode side, a second intermetallic compound layer that has been formed on the semiconductor element side, and a third layer that is constituted by a phase containing Sn and a sticks-like intermetallic compound part, which is sandwiched between the two layers of the first intermetallic compound layer and the second intermetallic compound layer, and the sticks-like intermetallic compound part is interlayer-bonded to both of the first intermetallic compound layer and the second intermetallic compound layer.

4 Claims, 8 Drawing Sheets

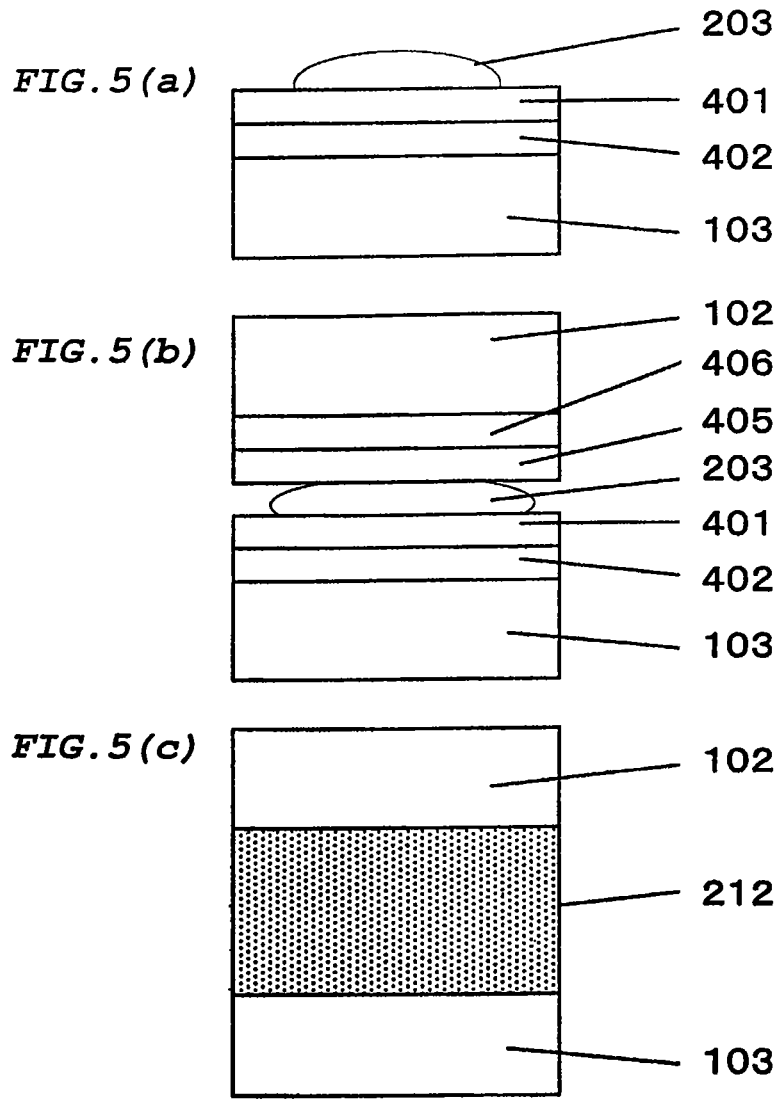

US 8,810,035 B2

SEMICONDUCTOR BONDING STRUCTURE BODY AND MANUFACTURING METHOD OF SEMICONDUCTOR BONDING STRUCTURE BODY

CROSS-REFERENCE TO RELATED APPLICATIONS

This application is a U.S. National Phase Application of PCT International Patent Application No. PCT/JP2011/005790, filed Oct. 17, 2011, claiming the benefit of priority of Japanese Patent Application No. 2010-237514, filed Oct. 22, 2010, all of which are incorporated by reference herein in their entirety.

TECHNICAL FIELD

The present invention relates to internal bonding of a semiconductor component, and relates to a semiconductor bonding structure body and so forth that via Sn-base solder bond an electrode to a semiconductor element of a power semiconductor module of which a particularly superior mechanical characteristic and heat resistance property is required.

BACKGROUND ART

In the electronics mounting field, due to a fear of the nocuous of lead or a rise in concern about the environment, bonding utilizing no lead is desired, and alternative materials have been developed and practicalized as to an Sn—Pb eutectic solder that is a general solder material.

On the other hand, materials alternative to high-temperature lead solder have been considered as the bonding materials for the semiconductor component internal part.

As candidate materials alternative to high-temperature lead solder, exemplified for solder materials are those of Au system, of Bi system, of Zn system, and of Sn system. Regarding the solder materials of Au system, for example, Au-20Sn and the like with the melting point of 280° C. have been partially practicalized but, since their principal ingredients are gold, they are not versatile for such reasons that they are hard in material property, the material costs are high and use is limited to small-sized components.

Bi the melting point of which is in the vicinity of 270° C. is acceptable in respect of the melting temperature but is poor in ductility and thermal conductivity and, for the solder of Zn system, since the elastic modulus is too high, there are problems of a mechanical characteristic and a heat resistance property in internal bonding of a semiconductor component.

On the other hand, regarding the solder materials of Sn system, they are, although having superior mechanical characteristics, poor in heat resistance properties with low melting points being less than 250° C. Hereupon, for the purposes of the heat-resistance-property improvement of Sn system, bonding materials have been considered such that the melting points are raised due to intermetallic compounding by forming CuSn compounds, for example. (see Japanese published patent application 2007-273982).

FIG. 6 is a sectional view of a conventional bonding structure body recorded in Japanese published patent application 2007-273982. In FIG. 6, the power semiconductor module 501 has the bonding part 504 between the power semiconductor element 502 and the electrode 503. For this bonding part 504, a CuSn compound is utilized as a bonding material.

SUMMARY OF INVENTION

Problems to be Solved by Invention

However, although the bonding material of the CuSn compound of Japanese published patent application 2007-273982 has, when mixed powder of Sn and Cu is utilized as the solder material, and bonding is carried out with sufficient time being spent, due to intermetallic compounding of Sn and Cu, as in FIG. 7, a heat resistance property of the bonding part 504 with respect to the heat that is applied while the power semiconductor module is mounted to the substrate, namely, a heat resistance property under an atmosphere of 260° C. that is a general reflow temperature, there is a possibility that cracks, detachment and the like are caused to arise in the bonding part 504 at the time of use of the power semiconductor module.

As for the reasons, it is considered that this is because, for the most portion of the bonding part 504, due to intermetallic compounding of Sn and Cu, the ductility of the bonding part 504 is lost, it incurs a thermal stress that arises at the time of power semiconductor module use, and the stress can not be alleviated.

On the other hand, when bonding is carried out without sufficient time being spent, as in FIG. 8, intermetallic compounding of Sn and Cu does not completely take place, and a significant amount of the portion of Sn remains so that the ductility of the bonding part is maintained, but a heat resistance property of the bonding part with respect to the heat that is applied while the power semiconductor module 501 is mounted to the substrate, namely, a heat resistance property under an atmosphere of 260° C. that is a general reflow temperature is lost.

This is because, in a case where intermetallic compounding of Sn and Cu is not completely carried out, Sn is left and, for example, Sn thereby remains in layers, there is a possibility that a defect, such as slippage and so forth between the semiconductor element and the electrode that follows remelting at the time of reflow, arises. Further, intermetallic compounds happen to be generated, but only a little amount of ball-shaped intermetallic compounds discretely comes into being.

Accordingly, the bonding structure body via the bonding material of said Japanese published patent application 2007-273982 has a problem that both of the stress alleviation property and the heat resistance property must be coped with.

An aspect of the present invention is, in view of the above-mentioned conventional problems, to furnish a semiconductor bonding structure body and so forth such that the heat resistance property, and the stress alleviation property are both coped with.

Means of Solving Problem

The $1^{st}$ aspect of the present invention is
a semiconductor bonding structure body in which, on a substrate electrode, a first intermetallic compound layer that contains Sn, a third layer that is constituted by a third intermetallic compound part containing Sn and a phase containing Sn, and a second intermetallic compound layer that contains Sn are overlaid in order, and an electrode of a semiconductor element is placed thereon, wherein
the first intermetallic compound layer and the second intermetallic compound layer have parts that allow interlayer bonding via the third intermetallic compound part.

The $2^{nd}$ aspect of the present invention is
a semiconductor bonding structure body according to the $1^{st}$ aspect of the present invention, wherein
the third intermetallic compound part is shaped like sticks.

The 3rd aspect of the present invention is
a semiconductor bonding structure body according to the 1st aspect of the present invention, wherein
the first intermetallic compound layer is constituted by an intermetallic compound that is made of Cu—Sn,
the second intermetallic compound layer is constituted by an intermetallic compound that is made of Cu—Sn,
the third intermetallic compound part is constituted by an intermetallic compound that is made of any one of Au—Sn and Ag—Sn, and
the phase containing Sn contains any one of Au and Ag.

The 4th aspect of the present invention is
a semiconductor bonding structure body according to the 1st aspect of the present invention, wherein
the first intermetallic compound layer is constituted by an intermetallic compound that is made of Ag—Sn,
the second intermetallic compound layer is constituted by an intermetallic compound that is made of Ag—Sn,
the third intermetallic compound part is constituted by an intermetallic compound that is made of Au—Sn, and
the phase containing Sn contains any one of Au and Ag.

The 5th aspect of the present invention is
a manufacturing method of a semiconductor bonding structure body, comprising:
a semiconductor-element-surface metallic film forming step of forming, on an electrode surface of a semiconductor element, a metallic film that forms an intermetallic compound with Sn;
an electrode-surface metallic film forming step of forming, on a substrate electrode surface, a metallic film that forms an intermetallic compound with Sn; and
a bonding step where, while an electrode face of the semiconductor element, on which the metallic film has been formed, is allowed to face a face of the substrate electrode, on which the metallic film has been formed, and bonding via a solder material containing Sn is carried out between the faces allowed to face each other, a first intermetallic compound layer that is formed on the face of the substrate electrode and a second intermetallic compound layer that is formed on the electrode face of the semiconductor element are, by a third intermetallic compound part that is formed by the solder material containing Sn, partly interlayer-bonded.

The 6th aspect of the present invention is
a manufacturing method of a semiconductor bonding structure body according to the 5th aspect of the present invention, wherein a material of the metallic film formed on a surface of the semiconductor element is any one of Ag and Cu or a combination of Ag and Cu,
a material of the metallic film formed on a surface of the electrode is any one of Au and Ag or a combination of Au and Ag, and
the solder material containing Sn is Sn-3 wt % Ag-0.5 wt % Cu.

Effects of Invention

As illustrated in the aforementioned, with the present invention, the semiconductor element and the electrode are bonded with good quality to enable the bonding reliability to be raised, by ensuring the stress alleviation property with respect to the thermal stress that arises in the temperature cycle at the time of use of the power semiconductor module and, at the same time, ensuring the heat resistance property of the bonding part with respect to the heat that is applied while the power semiconductor module is mounted to the substrate, to cope with both of the stress alleviation property and the heat resistance property.

BRIEF DESCRIPTION OF DRAWINGS

FIG. 5 is a manufacturing step flow diagram of a bonding structure body of Example 1 in an embodiment of the present invention.

MODES FOR CARRYING OUT INVENTION

Figure 1:
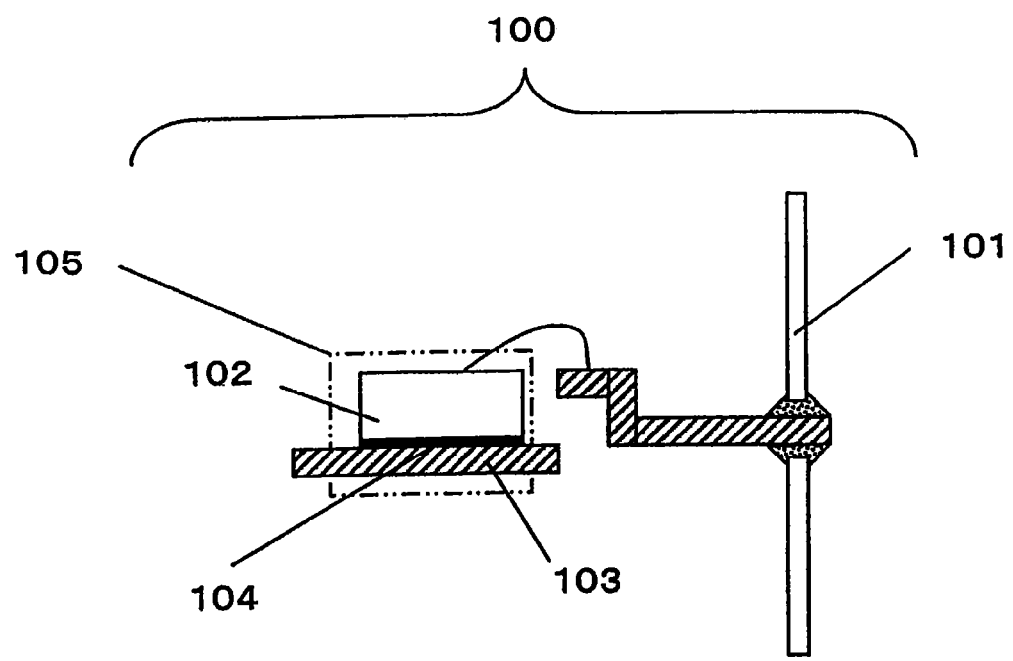
FIG. 1 is a sectional view of the power semiconductor module in an embodiment of the present invention.
Figure 2A:
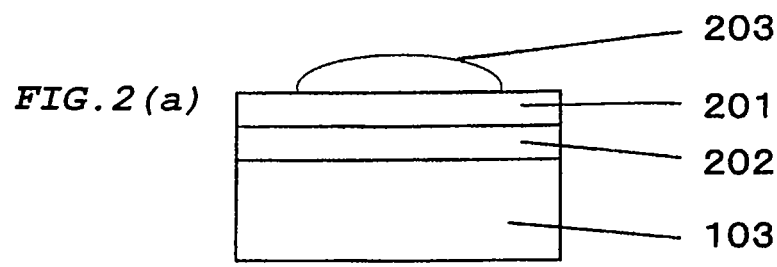
FIG. 2 is a manufacturing step flow diagram of a bonding structure body of Example 1 in an embodiment of the present invention.
Figure 2B:
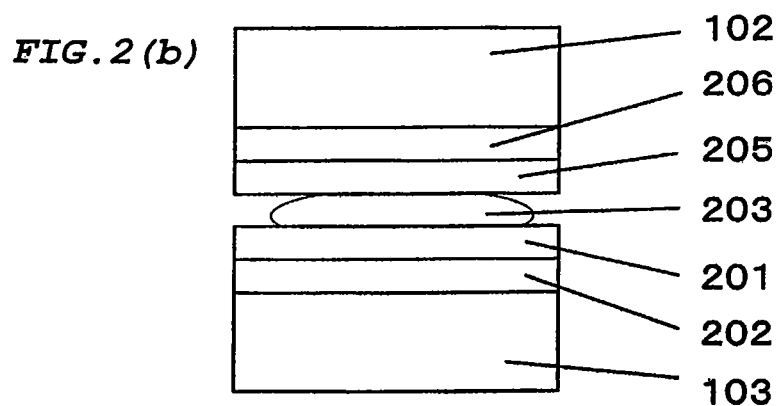
Figure 2C:
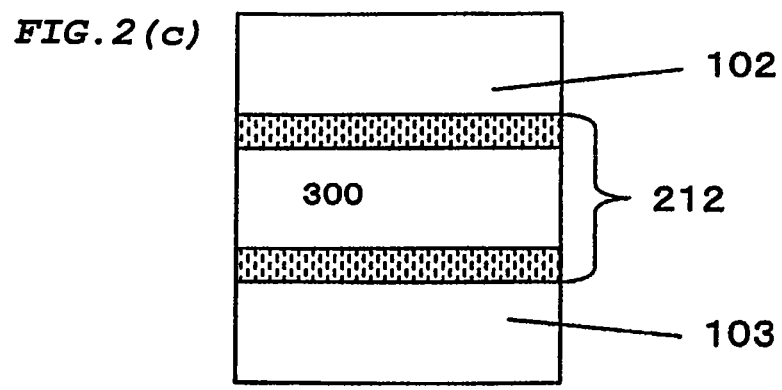

In the following, embodiments of the present invention are described, referring to the drawings.
FIG. 1 is a sectional view of the power semiconductor module 100 in an embodiment of the present invention.
The semiconductor element 102 is, via the bonding material 104, bonded to the substrate electrode 103 (hereafter simply written as the electrode 103) and forms the bonding structure body 105, and that bonding structure body 105 is mounted to the substrate 101.
Next, this bonding structure body 105 that has been formed is described in detail.
FIG. 2 is a manufacturing step flow diagram of a bonding structure body of Example 1 in an embodiment of the present invention.
FIG. 2(a) is a step diagram of supplying the solder material 203 to the electrode 103.
For the electrode 103 constituted by a Cu alloy that is utilized here, film formation of the Ag layer 202 with a thickness of 3 μm, and, the Au layer 201 with a thickness of 3 μm on the said Ag layer 202 is, by an electroplating method, allowed to be carried out beforehand.
While the solder material 203 is supplied, in a nitrogen atmosphere that contains hydrogen of 5%, the electrode 103 in a state of being heated to 260° C. is utilized.
On this Au layer 201, the solder material 203 of Sn-3 wt % Ag-0.5 wt % Cu (hereafter simply written as Sn-3Ag-0.5Cu) (melting point: 217° C.) in the form of wire with a length of 500-800 μm and a diameter φ of 1.0 mm is supplied.
Next the semiconductor element 102 is placed on the solder material 203.
FIG. 2(b) is a step diagram of placing the semiconductor element 102 on the solder material 203.
For the semiconductor element 102 constituted by GaN, with a thickness of 0.3 mm and a size of 4 mm×5 mm that is utilized here, film formation of the Cu layer 206 with a thickness of 10 μm, and the Ag layer 205 with a thickness of 5 μm thereon to the said Cu layer 206 is, by an electroplating method, allowed to be carried out beforehand.

While the semiconductor element 102 is placed, similarly to the supplying step of the solder material 203 described before, in a nitrogen atmosphere that contains hydrogen of 5%, the electrode 103 in a state of being heated to 260° C. has been utilized.

The semiconductor element 102 is, with a load of an extent of 50 gf-150 gf, placed on the solder material 203, which has been supplied to the electrode 103, so that this Ag layer 205 touches the solder material 203.

Next, by allowing natural cooling after leaving the semiconductor element 102 as it is for about 10 minutes from its placement on the solder material 203, with the electrode 103 kept, in a nitrogen atmosphere that contains hydrogen of 5%, in a state of being heated to 260° C., the bonding part 212 that allows the electrode 103 and the semiconductor element 102 to bond is allowed to form, and the bonding structure body 105 is manufactured.

Now, the bonding part 212 that allows the electrode 103 and the semiconductor element 102 to bond is described. FIG. 3(*a*) is a schematic diagram immediately after the semiconductor element 102 is placed on the solder material 203, which has been supplied to the electrode 103.

Due to the diffusion reaction between the Ag layer 205 shown in FIG. 2(*b*) and the solder material 203, and the diffusion reaction among the Au layer 201, the Ag layer 202 and the solder material 203, as in FIG. 3(*a*), the sticks-like intermetallic compound part 209 (corresponding to one example of the third intermetallic compound part to be described later) begins to form in which the sticks-like AgSn intermetallic compound part 209 and the sticks-like AuSn intermetallic compound part 209 are intermingled.

Now, a sticks-like one means a pillars-like one such that crystals that serve as nuclei have grown, and the aspect ratios are different.

Moreover at the same time, while forming the sticks-like intermetallic compound part 209 described before, the diffusion reaction between the Cu layer 206 shown in FIG. 2(*b*) and the solder material 203 is caused, as in FIG. 3(*a*), the CuSn intermetallic compound layer 208 (corresponding to one example of the second intermetallic compound layer to be described later) and the CuSn intermetallic compound layer 207 (corresponding to one example of the first intermetallic compound layer to be described later) begin to form.

FIG. 3(*b*) is a schematic diagram after leaving it as it is for 10 minutes from FIG. 3(*a*).

By leaving it as it is for 10 minutes in a state of being heated at 260° C., the sticks-like intermetallic compound part 209 that has formed in FIG. 3(*a*) in which the sticks-like AgSn intermetallic compound part 209 and the sticks-like AuSn intermetallic compound part 209 are intermingled, the CuSn intermetallic compound layer 208 and the CuSn intermetallic compound layer 207 grow.

FIG. 2(*c*) or FIG. 3(*c*) that is its detail drawing is a schematic diagram after natural cooling of FIG. 3(*b*) is allowed, and the bonding structure body has been completed.

In the bonding part 212, solidification takes place in a state where the sticks-like intermetallic compound part 209 that has formed in a state of FIG. 3(*b*), in which the sticks-like AgSn intermetallic compound part 209 and the sticks-like AuSn intermetallic compound part 209 are intermingled, and the phase 210 that contains Sn, which is a stress absorption part of an Sn/Au/Ag-intermingled construction, are sandwiched between the CuSn intermetallic compound layer 208 and the CuSn intermetallic compound layer 207 and, besides, the sticks-like AgSn intermetallic compound part 209 and the sticks-like AuSn intermetallic compound part 209 allow interlayer bonding of the upper and lower CuSn intermetallic compound layer 208 and CuSn intermetallic compound layer 207.

As the aforementioned, the electrode 103 and the semiconductor element 102 are bonded via the bonding part 212, that is to say, via the bonding part 212 that has solidified in a state where the sticks-like intermetallic compound part 209 in which the sticks-like AgSn intermetallic compound part 209 and the sticks-like AuSn intermetallic compound part 209 are intermingled, and the phase 210 that contains Sn, which is a stress absorption part of an Sn/Au/Ag-intermingled construction, are sandwiched between the CuSn intermetallic compound layer 208 and the CuSn intermetallic compound layer 207 and, besides, the sticks-like AgSn intermetallic compound part 209 and the sticks-like AuSn intermetallic compound part 209 allow interlayer bonding of the upper and lower CuSn intermetallic compound layer 208 and CuSn intermetallic compound layer 207.

Figure 3A:
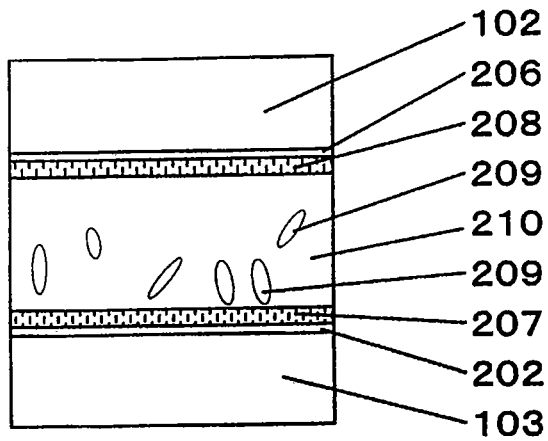
FIG. 3 is a sectional view that describes a manufacturing step of a bonding structure body of Example 1 in an embodiment of the present invention.
Figure 3B:
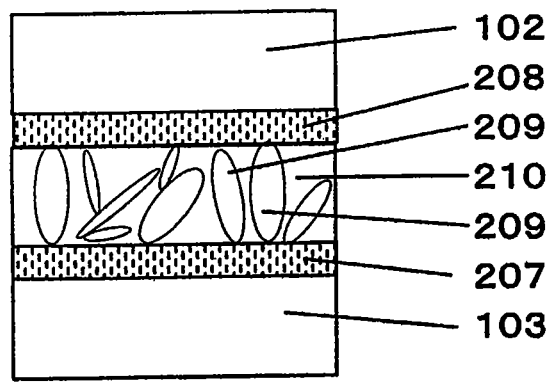
Figure 3C:
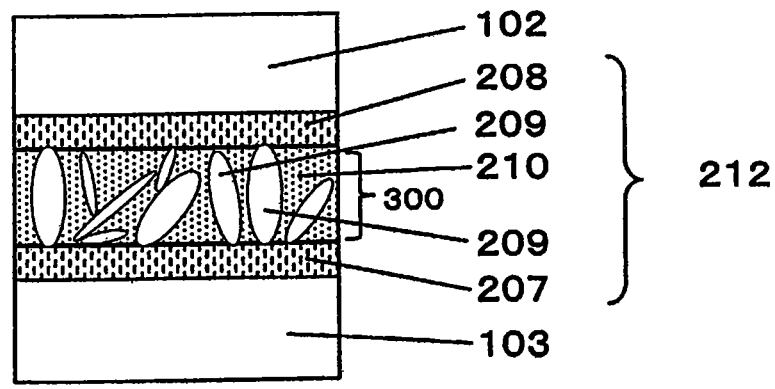
Figure 4A:
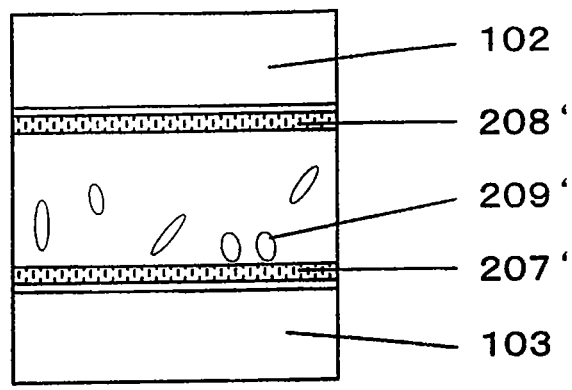
FIG. 4 is a diagram that has described, with terms such that the materials are generalized, the bonding structure body of FIG. 3 in an embodiment of the present invention.
Figure 4B:
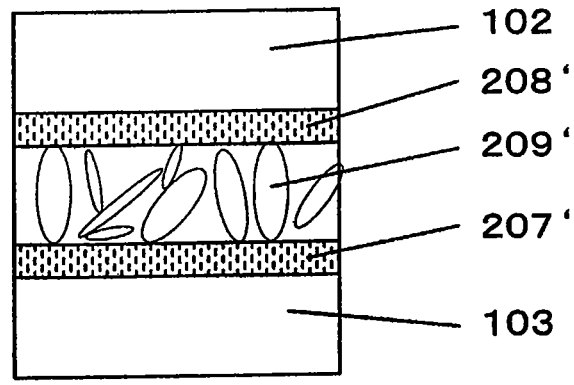
Figure 4C:
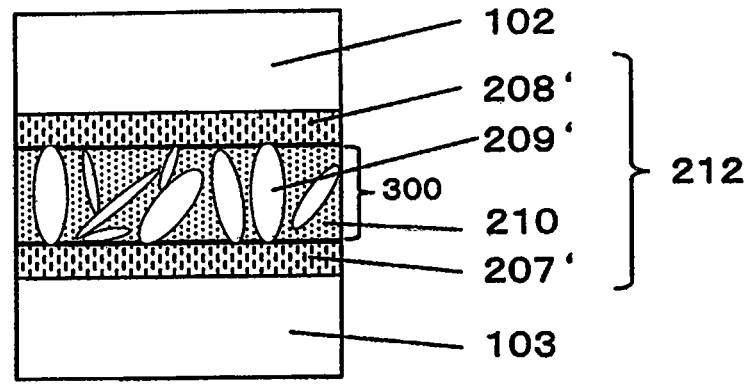
Figure 6:
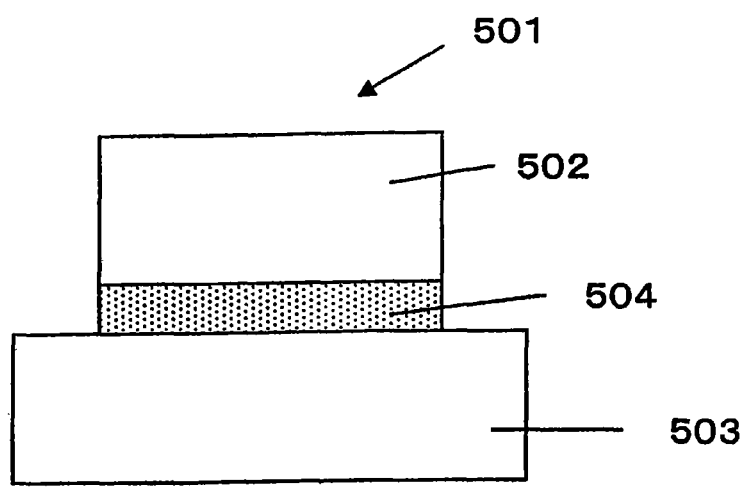
FIG. 6 is a sectional view of a bonding structure body in a conventional power semiconductor module.
Figure 7:
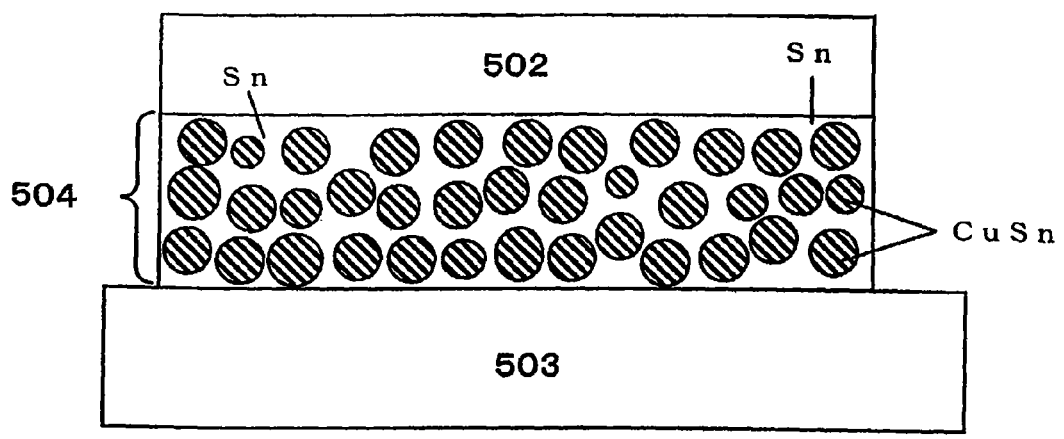
FIG. 7 is a sectional view of a power semiconductor module, which shows a case where the time for heating bonding in a manufacturing step of a conventional power semiconductor module is sufficiently long.
Figure 8:
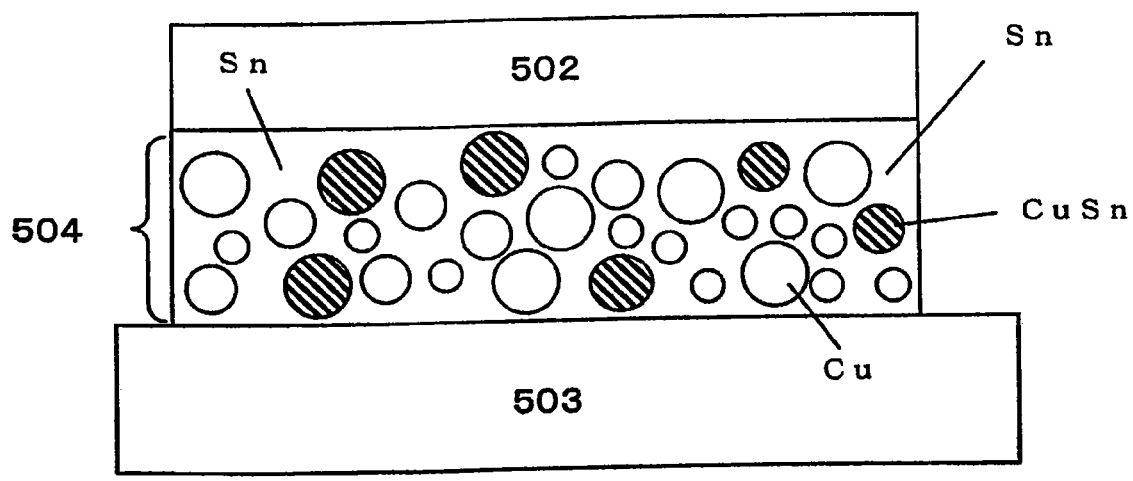
FIG. 8 is a sectional view of a power semiconductor module, which shows a case where the time for heating bonding in a manufacturing step of a conventional power semiconductor module is short.

FIG. 4 is a diagram that has described, with terms such that the materials are generalized (superordinately conceptualized), the bonding state of FIG. 3. Now, the first intermetallic compound layer 207' is a generalization of the above-mentioned CuSn intermetallic compound layer 207, and the second intermetallic compound layer 208' is a generalization of the above-mentioned CuSn intermetallic compound layer 208. Besides, the sticks-like intermetallic compound part 209' is a generalization of the above-mentioned sticks-like AgSn intermetallic compound part 209 and sticks-like AuSn intermetallic compound part 209, and is one example of the third intermetallic compound part of the present invention.

Further, by the sticks-like intermetallic compound part 209 that is one example of this third intermetallic compound part, and the phase 210 that contains Sn, is constituted the third layer 300 of the present invention. As other examples of this third intermetallic compound part, pillars-like or needles-like intermetallic compound parts and the like are given.

The bonding structure bodies that have been completed by the above-mentioned instance (the case of Example 1 with bonding time of 10 minutes) are used, so that wire bonding and sealing are implemented, power semiconductor modules are allowed to be formed and, for checking of cracks and detachment of the bonding part of the bonding structure body, the product yield has been checked.

For the checking method of the product yield, the products are observed with ultrasound images after 300 cycles of a temperature cycling test with −45° C. for low temperature side and 125° C. for high temperature side, cracks and detachment of the bonding part of the bonding structure body are judged, and the product yield (N number=20) has been calculated for cracks and detachment of less than 20% with respect to the surface area of the bonding part.

For the judgment of the product yield, distinguishments have been made so that O's are given for 80% or more, A's are given for 50% or more and less than 80%, and X's are given for less than 50%, and qualified products are ones with 80% or more (O).

Since the product yield of the power semiconductor modules of the bonding structure bodies that have been completed by the above-mentioned instance is 100%, O's are given, and they can be judged to be qualified products.

From this, cracks and detachment of the bonding part have not been recognized.

For the reasons why cracks and detachment of the bonding part of the bonding structure body in this power semiconductor module are not caused, the following are conjectured.

It is considered that it is because, in the bonding part 212 of the bonding structure body, the Sn/Au/Ag-intermingled construction exists that has greater ductility compared with the intermetallic compounds and, due to the distortion of the intermingled construction of Sn/Au/Ag, with respect to the thermal stress that arises in the temperature cycling test, the stress alleviation property has evolved.

Besides, when the heat resistance property for using the bonding structure body as a power semiconductor module is checked, the bonding strength of the semiconductor element of the bonding structure body and the electrode in shearing direction is 30 gf or more under the atmosphere of 260° C. with the reflow temperature supposed. It is presumed that this is because, by the connection (interlayer bonding) between the intermetallic compound layers and the sticks-like intermetallic compound parts due to the formation of the CuSn intermetallic compound layer 207, the CuSn intermetallic compound layer 208, and the sticks-like AgSn intermetallic compound part 209 and sticks-like AuSn intermetallic compound part 209, it has the heat resistance property of 260° C.

Further, since here also known is that the melting point of the CuSn intermetallic compound layers 207 and 208 is about 415° C., the melting points of the sticks-like AuSn intermetallic compound part 209 and the sticks-like AgSn intermetallic compound part 209 are about 260° C. and about 480° C., and any of them is 260° C. or more, it can be said that, by the connection between the intermetallic compound layers and the sticks-like intermetallic compound parts, it has the heat resistance property of 260° C.

With the constitution like this, the semiconductor element and the electrode are bonded with good quality to enable the bonding reliability to be raised by, via the bonding part 212 that has solidified in a state where the sticks-like intermetallic compound part 209 in which the sticks-like AgSn intermetallic compound part 209 and the sticks-like AuSn intermetallic compound part 209 are intermingled, and the phase 210 that contains Sn which is a stress absorption part of an Sn/Au/Ag-intermingled construction are sandwiched between the CuSn intermetallic compound layer 208 and the CuSn intermetallic compound layer 207 and, besides, the sticks-like AgSn intermetallic compound part 209 and the sticks-like AuSn intermetallic compound part 209 allow interlayer bonding of the upper and lower CuSn intermetallic compound layer 208 and CuSn intermetallic compound layer 207, bonding the semiconductor element and the electrode, and by coping with the ensurance of both of the stress alleviation property with respect to the thermal stress that arises in the temperature cycle and the heat resistance property of the bonding part with respect to the heat that is applied while the power semiconductor module is mounted to the substrate which have not been obtained with the conventional art.

Herewith, it can be said that the bonding structure body in the embodiment of the present invention has solved the conventional problems.

Next, with the material constitution and thickness of the layers being allowed to be changed for which the film formation has been carried out beforehand on the electrode and the semiconductor element, the stress alleviation property and the heat resistance property have been checked.

Now, the name of each layer is defined as follows to carry out description. As in FIG. 5, the names of the films are given for which the film formation has been carried out on the electrode by an electroplating method such that the electrode-surface second processing layer 402 and the electrode-surface first processing layer 401 are provided in order of adjacency to the face of the electrode and next, the names of the films are given for which the film formation has been carried out on the semiconductor element by an electroplating method such that the element-surface second processing layer 406 and the element-surface first processing layer 405 are provided in order of adjacency to the face of the element, so that the bonding parts have been allowed to be formed with the constitution and thickness of the layers being allowed to be changed. Table 1 shows examples of the constitution that has been considered in the present invention embodiment.

TABLE 1

| Electrode-surface First Processing Layer/ Electrode-surface Second Processing Layer | Element-surface First Processing Layer/ Element-surface Second Processing Layer | | | |
|---|---|---|---|---|
| | Ag5 μm/ Cu10 μm | Ag5 μm/ None | Cu10 μm/ None | None |
| Au3 μm/Ag3 μm | Example 1 | Example 4 | Example 7 | — |
| Au3 μm/None | Example 2 | Example 5 | Example 8 | — |
| Ag3 μm/None | Example 3 | Example 6 | Example 9 | — |
| None | — | — | — | Conventional Example |

IN EXAMPLES 1-9, THE SOLDER MATERIALS ARE Sn—3Ag—0.5Cu IN CONVENTIONAL EXAMPLE, THE SOLDER MATERIAL IS MIXED POWDER OF Sn AND Cu

The ordinate of Table 1 shows the constitution and thickness of the layers for which the film formation has been carried out on the electrode, and the abscissa shows the constitution and thickness of the layers for which the film formation has been carried out on the semiconductor element.

For example, in Example 1, the electrode for which the film formation has been carried out with two layers such that Ag3 μm as the electrode-surface second processing layer 402 and Au3 μm as the electrode-surface first processing layer 401 are provided in order of adjacency to the face of the electrode, and the semiconductor element for which the film formation has been carried out such that Cu10μ as the element-surface second processing layer 406 and Ag5 μm as the element-surface first processing layer 405 are provided in order of adjacency to the face of the semiconductor element are bonded via the solder material, and the bonding part has been allowed to be formed.

Further, for the solder material for bonding, which is allowed to be Sn-3Ag-0.5Cu in Examples, mixed powder of Sn and Cu has been utilized in Conventional example.

Next, Table 2 is the one for summary as to the composition of the bonding parts of the bonding structure bodies that have been obtained from each of Examples 1-9 of Table 1. Further, the case of Conventional example is a case with the heating time for bonding of 60 minutes. The cases of Examples 1-9 are cases with the heating time for bonding of 10 minutes-60 minutes.

TABLE 2

| | Bonding Part | | | |
|---|---|---|---|---|
| | First Intermetallic Compound Layer | Second Intermetallic Compound Layer | Sticks-like Intermetallic Compound Part | Phase That Contains Sn |
| Composition of Example 1 | CuSn Compound | CuSn Compound | AuSn Compound and AgSn Compound | Sn/Au/Ag-intermingled Construction |
| Composition of Example 2 | CuSn Compound | CuSn Compound | AuSn Compound and AgSn Compound | Sn/Au/Ag-intermingled Construction |
| Composition of Example 3 | CuSn Compound | CuSn Compound | AgSn Compound | Sn/Ag-intermingled Construction |
| Composition of Example 4 | AgSn Compound | AgSn Compound | AuSn Compound and AgSn Compound | Sn/Au/Ag-intermingled Construction (Minuscule Amount of Cu) |
| Composition of Example 5 | AgSn Compound | AgSn Compound | AuSn Compound and AgSn Compound | Sn/Au/Ag-intermingled Construction |
| Composition of Example 6 | AgSn Compound | AgSn Compound | AgSn Compound | Sn/Ag-intermingled Construction (Minuscule Amount of Cu) |
| Composition of Example 7 | CuSn Compound | CuSn Compound | AuSn Compound and AgSn Compound | Sn/Au/Ag-intermingled Construction |
| Composition of Example 8 | CuSn Compound | CuSn Compound | AuSn Compound | Sn/Au-intermingled Construction (Minuscule Amount of Ag) |
| Composition of Example 9 | CuSn Compound | CuSn Compound | AgSn Compound | Sn/Ag-intermingled Construction |
| Conventional Example | CuSn Compound | | None | None |

Further, the composition of the bonding parts of each of Examples and Conventional example in Table 2 has been examined utilizing an EDX (energy dispersive X-ray fluorescence analysis) device.

But, for the constitution of Conventional example the bonding part is formed only with the CuSn compound by the Sn and Cu mixed flour of the conventional art.

Table 3 shows the product yields and the heat resistance properties of the bonding structure bodies with the time before the natural cooling start after the placement of the semiconductor element on the electrode to which the solder material has been supplied being allowed to be changed with 10 minutes, 20 minutes, 30 minutes and 60 minutes, utilizing the electrode and semiconductor element of each of Examples 1-9 of Table 1.

TABLE 3

| | | Bonding Time (FIGS. 3(a)-(c)), Minutes | | | |
|---|---|---|---|---|---|
| | | 10 | 20 | 30 | 60 |
| Example 1 | Product Yield 260° C. Heat Resistance Property | ○ 100% | ○ 90% OK | △ 50% | X 30% |
| Example 2 | Product Yield 260° C. Heat Resistance Property | ○ 100% NG | ○ 85% | △ 50% OK | X 30% |
| Example 3 | Product Yield 260° C. Heat Resistance Property | ○ 100% NG | ○ 85% | ○ 80% OK | X 30% |
| Example 4 | Product Yield 260° C. Heat Resistance Property | ○ 100% NG | ○ 85% | △ 50% OK | X 30% |

TABLE 3-continued

| | | Bonding Time (FIGS. 3(a)-(c)), Minutes | | | |
|---|---|---|---|---|---|
| | | 10 | 20 | 30 | 60 |
| Example 5 | Product Yield 260° C. Heat Resistance Property | ○ 100% NG | ○ 85% | △ 50% OK | X 30% |
| Example 6 | Product Yield 260° C. Heat Resistance Property | ○ 100% NG | ○ 85% | ○ 80% OK | X 30% |
| Example 7 | Product Yield 260° C. Heat Resistance Property | ○ 95% NG | ○ 85% | ○ 80% OK | X 30% |
| Example 8 | Product Yield 260° C. Heat Resistance Property | ○ 95% NG | ○ 80% | ○ 80% OK | X 30% |
| Example 9 | Product Yield 260° C. Heat Resistance Property | ○ 95% NG | ○ 80% | ○ 80% OK | X 30% |
| Conventional Example | Product Yield 260° C. Heat Resistance Property | ○ 90% | ○ 80% NG | △ 50% | X 20% OK |

For the product yields, the bonding structure bodies that have been obtained in each of Examples 1-9 of Table 1 are utilized, so that wire bonding and sealing are implemented, power semiconductor modules are allowed to be formed and, for checking of cracks and detachment of the bonding parts of the bonding structure bodies, the product yields have been checked.

For the checking method of the product yields, the products are observed with ultrasound images after 300 cycles of a temperature cycling test with −45° C. for low temperature side and 125° C. for high temperature side, cracks and detachment of the bonding part of the bonding structure body are judged, and the product yield (N number=20) has been calculated for cracks and detachment of less than 20% with respect to the surface area of the bonding part.

For the judgment of the product yields, distinguishments have been made so that O's are given for 80% or more, Δ's are given for 50% or more and less than 80%, and X's are given for less than 50%, and qualified products are ones with 80% or more (O).

Moreover, for the heat resistance properties, in order to use the bonding structure body as a power semiconductor module, the heat resistance property at 260° C. with the reflow temperature supposed has been checked.

For the 260° C. heat resistance properties, it is judged to have the 260° C. heat resistance property provided that the bonding strength of the semiconductor element of the bonding structure body and the electrode in shearing direction is 30 gf or more under the atmosphere of 260° C.

Namely, if the bonding strength is 30 gf or more under the atmosphere of 260° C., the sticks-like intermetallic compound part 209' touches both of the first intermetallic compound layer 207' and the second intermetallic compound layer 208' and allows interlayer bonding, so that it is presumed to have the heat resistance property of 260° C.

According to the result of Table 3, regarding the product yields, for bonding time of 10-20 minutes Examples 1-9 and Conventional example both give qualified products with judgment of 0, for bonding time of 30 minutes Examples 3, 6 and 7-9 give qualified products with judgment of 0, for bonding time of 60 minutes Examples 1-9 and Conventional example both give the judgments of X, and the extent of the occurrence of cracks and detachment increases when the bonding time becomes long.

For the product yields of the bonding structure bodies of Examples in the embodiment of the present invention, the judgments are of Δ or X partly for the step time of 30 minutes and all for 60 minutes and, regarding this, it is considered that the growing of the intermetallic compound layers and sticks-like intermetallic compounds has excessively progressed by the progress of the step time, the phase that contains Sn has become nonexistent which is made from Sn and Au or Ag, and the stress alleviation property with respect to the thermal stress that arises in the temperature cycling test has become unevolved.

Besides, according to the result of Table 3, regarding the heat resistance properties at 260° C., for bonding time of 10 minutes only Example 1 gives OK, for bonding time of 20 minutes Examples 1, 2, 4, 5, 7 and 8 give the judgments of being good, for bonding time of 30 minutes Examples 1-9 give the judgments of being good, for bonding time of 60 minutes Examples 1-9 and Conventional example both give the judgments of being good, and the heat resistance property increases when the bonding time becomes long. The reason is that the sticks-like intermetallic compound part 209' touches both of the first intermetallic compound layer 207' and the second intermetallic compound layer 208' and the extent of connection has continued increasing.

From the aforementioned result, when seeing the regions that have both the judgment of O for the product yield with the stress alleviation property and the judgment of being good for the 260° C. heat resistance property with the heat resistance property, as the regions ones for bonding time of 10 minutes and 20 minutes are taken in Examples 1, and one for bonding time of 20 minutes in Examples 2. One for 30 minutes is taken in Examples 3, one for 20 minutes in Examples 4, one for 20 minutes in Examples 5, one for 30 minutes in Examples 6, one for 20-30 minutes in Examples 7, one for 20-30 minutes in Examples 8, and one for 30 minutes in Examples 9.

In contrast in Conventional example, a region does not exist such that both of the product yield and the ensurance of the heat resistance property of 260° C. with the judgment of being good are coped with.

It is considered that the reason is because, with the bonding structure body of Conventional example that ensures the heat resistance property of 260° C., regarding the product yields of the bonding structure bodies being of judgment of Δ or X for 30 minutes and 60 minutes, due to bonding only with a fragile CuSn intermetallic compound part of low ductility, the stress alleviation property with respect to the thermal stress that arises in the temperature cycling test is not obtained and cracks and detachment of the bonding part of the bonding structure body has occurred.

In contrast it is considered that, in the bonding structure bodies of Examples in the embodiment of the present invention the phase that contains Sn exists which has greater ductility compared with the intermetallic compounds and, due to the distortion of the phase that contains Sn with respect to the thermal stress that arises in the temperature cycling test the stress alleviation property evolves, and, the sticks-like intermetallic compound part 209' touches both of the first intermetallic compound layer 207' and the second intermetallic compound layer 208' to allow connection, and the heat resistance property of 260° C. thereby evolves, so that coping with both of the stress alleviation property and the heat resistance property has been able to be realized.

Accordingly, in the present invention embodiment, a region is able to be ensured such that both of the product yield of the temperature cycling test and the ensurance of the heat resistance property of 260° C. with judgment of being good are coped with.

In the embodiment of the present invention, by allowing, in the border portion between the semiconductor element 102 and the bonding part 212 and the border portion between the substrate electrode 103 and the bonding part 212, the intermetallic compound layers 207' and 208' to be formed that are made from CuSn compounds or AgSn compounds and, for the other bonding parts, allowing the third layer 300 with the sticks-like intermetallic compound part 209' in which AuSn compounds and AgSn compounds are intermingled and the phase 210 that contains Sn, which are made from Sn, Au and Ag, to be formed, coping with both of the stress alleviation property and the heat resistance property has been realized.

In order to realize such structure, for example, in Example 1, Au or Ag that could form sticks-like intermetallic compound parts with Sn in the solder material has been arranged in nearer portions with the order of adjacency to the solder material, of the electrode-surface processing layers and the semiconductor-element-surface processing layers, and Ag or Cu that could form intermetallic compound layers with Sn in the solder material has been arranged in farther portions.

Further, in Examples 1-9, regarding the thickness of those, it is required to be decided in relation to the amount of the solder material.

Namely, in the present invention embodiment, with a semiconductor element with a thickness of 0.3 mm and a size of 4 mm×5 mm that is constituted by GaN being allowed to be a target, the amount of the solder material has been determined so that the thickness of the bonding part becomes 25-35 μm. The solder material 203 of Sn-3Ag-0.5Cu (melting point:

217° C.) in the form of wire with a length of 500-800 μm and a diameter φ of 1.0 mm has been supplied.

With respect to this amount of the solder material, with respect to the intermetallic compound layers 207' and 208' that are made from CuSn compounds or AgSn compounds of the border portion between the semiconductor element 102 and the bonding part 212 and the border portion between the electrode 103 and the bonding part 212, the sticks-like intermetallic compound part 209' that is made from AuSn compounds and AgSn compounds is required to allow the connection between the semiconductor element and the electrode, and, the thickness of each of the layers of the electrode-surface processing layers and the semiconductor-element-surface processing layers are required to be decided so that the phase 210 that contains Sn exists which is made from Sn and Au or Ag.

Namely, in a case where the supplying amount of Cu, Ag and Au is too much that form compounds with Sn, there arises a possibility that the phase that contains Sn becomes nonexistent which is made from Sn and Au or Ag, and the stress alleviation property with respect to the thermal stress that arises in the temperature cycling test becomes unevolved in a case where the phase that contains Sn does not exist.

Moreover, in a case where the supplying amount of Cu, Ag and Au is too little that form compounds with Sn, there arises a possibility that the intermetallic compound layers 207' and 208' that are made from CuSn compounds or AgSn compounds of the border portion between the semiconductor element 102 and the bonding part 212 and the border portion between the electrode 103 and the bonding part 212, and the sticks-like intermetallic compound part 209' that is made from AuSn compounds and AgSn compounds are not connected and, in a case where the intermetallic compound layers 207' and 208' and the sticks-like intermetallic compound part 209' are not connected, the heat resistance property of 260° C. becomes unevolved.

Further, the order of arrangement for the Au—Ag layer, in Example 1, may be reversed. That is to say, in Example 1, as to the electrode-surface processing layer Au (the solder material side)/Ag (the electrode side), since Au is, in the diffusion velocity with respect to Sn in the solder material, faster than Ag, the placement is carried out so that Au is on the side for first getting adjacent to the solder material, and Ag is on the side for getting adjacent next to Au. When the order for the layer is replaced with Ag (the solder material side)/Au (the electrode side), the diffusion of Ag to the solder material now serves as the rate controlling, and there arises a possibility that the time for ensuring the heat resistance property gets late, but the ensurance of the heat resistance by the intermetallic compound formation is possible.

By contrast, as to the element-surface processing layer Ag (the solder material side)/Cu (the element side), the AgSn compound is required to be allowed to be formed as the sticks-like intermetallic compound part, and the CuSn compound as the layers-like intermetallic compound. Supposing that the order for the layer is replaced as Cu (the solder material side)/Ag (the element side), since the layers-like intermetallic compound CuSn compound is first formed, the sticks-like intermetallic compound part AgSn compound becomes less likely to be formed in the solder material. Accordingly, for the element-surface processing layer the order of Ag (the solder material side)/Cu (the element side) is required.

Further, it does not matter if the constitution of the electrode-surface processing layer and the constitution of the element-surface processing layer are replaced.

Moreover, as to the temperature during bonding, 260° C. is desirable as described above. It is purported that a general soldering temperature is desired to be the melting point +30° C. of the solder material. In the present embodiment, since the melting viscosity of the solder material heightens due to the diffusion of chemical elements like Au, Ag and Cu into the solder material at the time of soldering, the wettability of the solder material is degraded. On that account, by allowing it to be about +40° C. (besides raised by 10° C.) rather than the melting point of the solder material, the wettability of the solder material is ensured. When it is excessively raised to be a high temperature, there arises a problem of the warp of electrodes.

Moreover, as to the solder material, it may be an arbitrary material as long as it is a lead-free solder. For general lead-free solders, SnAg system (Sn3.5Ag and Sn3.5Ag0.5Bi6In), CuSn system (Sn0.7Cu0.05Ni), SnAgCu system (Sn3Ag0.5Cu) and SnBi system (Sn58Bi) are known. In the present embodiment, since intermetallic compounds are formed by allowing chemical elements like Au, Ag and Cu to diffuse to Sn in the solder material from the semiconductor element or electrode side, and the phase that contains Sn must be formed, it is desirable that the amount of Sn in the solder material be large. Accordingly, the solder material may be a lead-free solder that is not only Sn3Ag0.5Cu but Sn3.5Ag, Sn3.5Ag0.5Bi6In or Sn0.7Cu0.05Ni, and may be an Sn simple substance.

Moreover, as to the thickness of the processing layers, 3 μm, 5 μm and 10 μm are desirable. That is to say, in a case of the constitution of the electrode-surface processing layer Ag3 μm and the element-surface processing layer Cu5 μm, with respect to the solder material: Sn-3Ag-0.5Cu in the form of wire with a diameter φ of 1.0 mm, the length 500-800 μm (Example 9), after Ag of the electrode-surface processing layer and Cu of the element-surface processing layer are all diffused into the solder material (30 minutes), the heat resistance property can be ensured. Accordingly, at minimum the electrode-surface processing layer Ag3 μm and the element-surface processing layer Cu5 μm are required. Moreover, as in Example 7, when Au3 μm is fed as the electrode-surface processing layer, for example, shortening of the process time can be achieved.

Industrial Applicability

A semiconductor bonding structure and a manufacturing method of the present invention are useful as power semiconductor modules since the semiconductor element and the electrode are bonded with good quality to enable the bonding reliability to be raised, by ensuring the stress alleviation property with respect to the thermal stress that arises in the temperature cycle at the time of use of the power semiconductor module and, at the same time, ensuring the heat resistance property of the bonding part with respect to the heat that is applied while the power semiconductor module is mounted to the substrate, to cope with both of the stress alleviation property and the heat resistance property.

| Description of Symbols | |
| --- | --- |
| 101 | substrate |
| 102 | semiconductor element |
| 103 | electrode |
| 104 | bonding material |
| 105 | bonding structure body |
| 201 | Au layer |
| 202 | Ag layer |
| 203 | solder material |
| 205 | Ag layer |

-continued

| | Description of Symbols |
|---|---|
| 206 | Cu layer |
| 207' | first intermetallic compound layer |
| 207 | CuSn intermetallic compound layer |
| 208' | second intermetallic compound layer |
| 208 | CuSn intermetallic compound layer |
| 209' | sticks-like intermetallic compound part (third intermetallic compound part) |
| 209 | sticks-like AgSn intermetallic compound part |
| 209 | sticks-like AuSn intermetallic compound part |
| 210 | phase that contains Sn |
| 212 | bonding part |
| 300 | third layer |
| 401 | electrode-surface first processing layer |
| 402 | electrode-surface second processing layer |
| 405 | element-surface first processing layer |
| 406 | element-surface second processing layer |

The invention claimed is:

1. A semiconductor bonding structure body in which, on a substrate electrode, a first intermetallic compound layer that contains Sn, a third layer that is constituted by a third intermetallic compound part containing Sn and a phase containing Sn, and a second intermetallic compound layer that contains Sn are overlaid in order, and an electrode of a semiconductor element is placed thereon, wherein
the first intermetallic compound layer and the second intermetallic compound layer have parts that allow interlayer bonding via the third intermetallic compound part, and
the third intermetallic compound part is shaped like sticks.

2. A semiconductor bonding structure body in which, on a substrate electrode, a first intermetallic compound layer that contains Sn, a third layer that is constituted by a third intermetallic compound part containing Sn and a phase containing Sn, and a second intermetallic compound layer that contains Sn are overlaid in order, and an electrode of a semiconductor element is placed thereon, wherein
the first intermetallic compound layer and the second intermetallic compound layer have parts that allow interlayer bonding via the third intermetallic compound part,
the first intermetallic compound layer is constituted by an intermetallic compound that is made of Cu—Sn,
the second intermetallic compound layer is constituted by an intermetallic compound that is made of Cu—Sn,
the third intermetallic compound part is constituted by an intermetallic compound that is made of any one of Au—Sn and Ag—Sn, and
the phase containing Sn contains any one of Au and Ag.

3. A semiconductor bonding structure body according to claim 1, wherein
the first intermetallic compound layer is constituted by an intermetallic compound that is made of Ag—Sn,
the second intermetallic compound layer is constituted by an intermetallic compound that is made of Ag—Sn,
the third intermetallic compound part is constituted by an intermetallic compound that is made of Au—Sn, and
the phase containing Sn contains any one of Au and Ag.

4. A manufacturing method of a semiconductor bonding structure body, comprising:
a semiconductor-element-surface metallic film forming step of forming, on an electrode surface of a semiconductor element, a metallic film that forms an intermetallic compound with Sn;
an electrode-surface metallic film forming step of forming, on a substrate electrode surface, a metallic film that forms an intermetallic compound with Sn; and
a bonding step where, while an electrode face of the semiconductor element, on which the metallic film has been formed, is allowed to face a face of the substrate electrode, on which the metallic film has been formed, and bonding via a solder material containing Sn is carried out between the faces allowed to face each other, a first intermetallic compound layer that is formed on the face of the substrate electrode and a second intermetallic compound layer that is formed on the electrode face of the semiconductor element are, by a third intermetallic compound part that is formed by the solder material containing Sn, partly interlayer-bonded wherein
a material of the metallic film formed on a surface of the semiconductor element is any one of Ag and Cu or a combination of Ag and Cu,
a material of the metallic film formed on a surface of the electrode is any one of Au and Ag or a combination of Au and Ag, and
the solder material containing Sn is Sn-3wt % Ag-0.5wt % Cu.

* * * * *